US012593740B2

(12) United States Patent
Hsu et al.

(10) Patent No.: US 12,593,740 B2
(45) Date of Patent: Mar. 31, 2026

(54) PACKAGE STRUCTURE

(71) Applicant: Advanced Semiconductor Engineering, Inc., Kaohsiung (TW)

(72) Inventors: An-Hsuan Hsu, Kaohsiung (TW); Cheng-Yuan Kung, Kaohsiung (TW); Yaohsin Chou, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 274 days.

(21) Appl. No.: 18/207,087

(22) Filed: Jun. 7, 2023

(65) Prior Publication Data

US 2024/0413061 A1     Dec. 12, 2024

(51) Int. Cl.
| | |
|---|---|
| *H01L 23/498* | (2006.01) |
| *H01L 23/00* | (2006.01) |
| *H05K 1/185* | (2026.01) |
| *H01L 25/065* | (2023.01) |
| *H10B 80/00* | (2023.01) |

(52) U.S. Cl.
CPC ...... *H01L 23/49811* (2013.01); *H01L 23/562* (2013.01); *H05K 1/185* (2013.01); *H01L 24/16* (2013.01); *H01L 24/32* (2013.01); *H01L 24/73* (2013.01); *H01L 25/0655* (2013.01); *H01L*

*2224/16227* (2013.01); *H01L 2224/32225* (2013.01); *H01L 2224/73204* (2013.01); *H05K 2201/10015* (2013.01); *H10B 80/00* (2023.02)

(58) Field of Classification Search
CPC . H01L 23/498; H01L 23/00; H01L 23/49811; H01L 23/562; H05K 1/185; H10B 80/00
USPC ......................................................... 174/261
See application file for complete search history.

(56) References Cited

U.S. PATENT DOCUMENTS

| | | | | |
|---|---|---|---|---|
| 11,062,985 | B2 | 7/2021 | Huang | |
| 2008/0239683 | A1* | 10/2008 | Brodsky | ................ H01R 12/52 |
| | | | | 29/854 |
| 2018/0128553 | A1* | 5/2018 | Lewis | ..................... F28F 3/022 |
| 2023/0082767 | A1* | 3/2023 | Chiu | ....................... H01L 24/32 |
| | | | | 257/659 |

* cited by examiner

*Primary Examiner* — Tremesha W Burns
(74) *Attorney, Agent, or Firm* — Foley & Lardner LLP

(57) ABSTRACT

A package structure is provided. The package structure includes a substrate, a wiring structure, and a wire bundle structure. The wiring structure is over the substrate. The wire bundle structure is between the wiring structure and the substrate. The wire bundle structure includes a first wire bundle extending from the substrate and a second wire bundle extending from the wiring structure and contacting the first nanowire bundle. The wire bundle structure is configured to reduce a variation in a distance of a gap between the substrate and the wiring structure.

20 Claims, 16 Drawing Sheets

PACKAGE STRUCTURE

BACKGROUND

1. Technical Field

The present disclosure relates generally to a package structure.

2. Description of the Related Art

With the continuous developments of miniaturization of package structures, pitches between conductive terminals of electronic components and/or substrates in the package structures have been decreased toward 20-30 μm or even smaller. In current package structures, soldering materials (e.g., solder pastes) are used to bond conductive terminals of electronic components and/or substrates. However, the soldering materials, after being reflowed, may cause undesired bridging issues between conductive terminals that are not supposed to connect to each other.

SUMMARY

In one or more arrangements, a package structure includes a substrate, a wiring structure, and a wire bundle structure. The wiring structure is over the substrate. The wire bundle structure is between the wiring structure and the substrate. The wire bundle structure includes a first wire bundle extending from the substrate and a second wire bundle extending from the wiring structure and contacting the first nanowire bundle. The wire bundle structure is configured to reduce a variation in a distance of a gap between the substrate and the wiring structure.

In one or more arrangements, a package structure includes a lower conductive structure, an upper conductive structure, a filling layer, and an attachment structure. The upper conductive structure is over the lower conductive structure. The filling layer is between the upper conductive structure and the lower conductive structure. The attachment structure is in the filling layer and configured to reduce the filling layer from overflowing out of the package structure.

BRIEF DESCRIPTION OF THE DRAWINGS

Aspects of the present disclosure are better understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
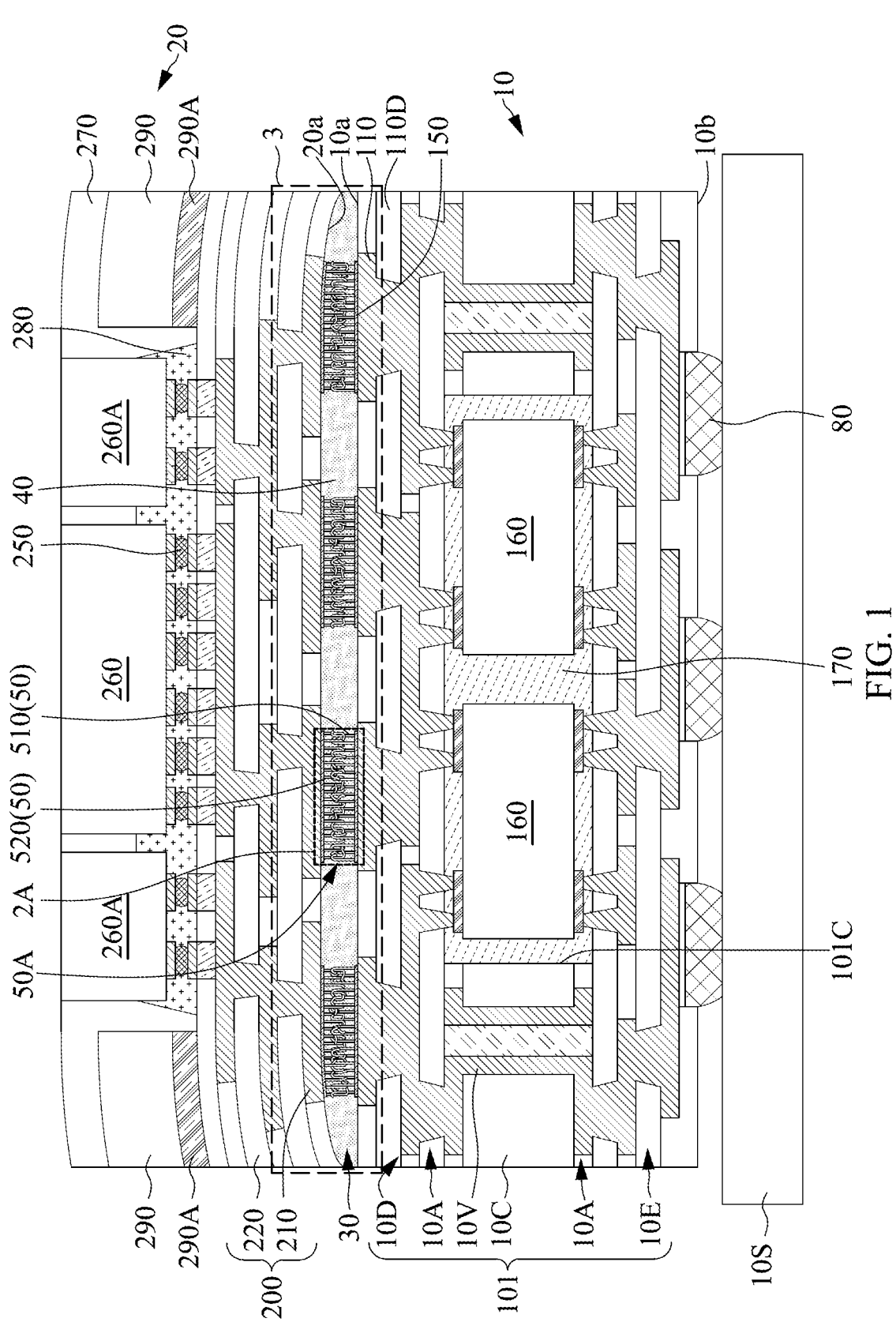
FIG. 1 is a cross-section of a package structure in accordance with some arrangements of the present disclosure.

FIG. 1 is a cross-section of a package structure 1 in accordance with some arrangements of the present disclosure. The package structure 1 may include a substrate 10, an electronic module 20, an attachment structure 30, and electrical contacts 80.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, which may include such as a plurality of conductive traces and/or a plurality of conductive vias. The interconnection structure may include a redistribution layer (RDL) and/or a grounding element. In some arrangements, the substrate 10 may include such as an organic substrate or a leadframe. The substrate 10 may be referred to as a wiring structure, a conductive structure (e.g., a lower conductive structure), or a conductive carrier.

In some arrangements, the substrate 10 may include a multi-layer substrate 101 which includes a core layer 10C, conductive structures 10A and 10B disposed on opposite surfaces (e.g., an upper surface and a bottom surface) of the core layer 10C, and dielectric structures 10D and 10E disposed on opposite surfaces of the core layer 10C. The conductive structure 10A may include a plurality of traces, vias, and/or pads formed or disposed in the dielectric structure 10D, and the conductive structure 10B may include a plurality of traces, vias, and/or pads formed or disposed in the dielectric structure 10E. The substrate 10 (or the substrate 101) may include one or more conductive vias 10V penetrating the core layer 10C to electrically connect the conductive structures 10A and 10B. The conductive via 10V may include a conductive liner connected to the conductive structures 10A and 10B and an insulating filler covered or surrounded by the conductive liner. In some arrangements, the substrate 10 has a surface 10a (also referred to as an upper surface or a top surface) and a surface 10b (also referred to as a lower surface or a bottom surface) opposite to the surface 10a. The substrate 10 may be free of solders, solder pastes, or other soldering materials on the upper surface (e.g., the surface 10a) of the substrate 10.

In some arrangements, the substrate 10 (or the conductive structure 10A) includes one or more conductive pads (e.g., conductive pads 110) in proximity to or adjacent to the surface 10a of the substrate 10. In some arrangements, the substrate 10 further includes one or more electronic components 160 embedded in the substrate 10. In some arrangements, the electronic components 160 are embedded in the substrate 101. In some arrangements, the substrate 10 further includes a filling layer 170 filled in one or more gaps between the electronic components 160 and the substrate 101. For example, the substrate 101 may include a cavity 101C penetrating the core layer 10C and optionally portions of the dielectric structures 10D and 10E, the electronic components 160 are disposed in the cavity 101C, and the filling layer 170 is filled in the cavity 101C. The filler layer 170 may be filled in one or more gaps between the electronic components 160 and inner sidewalls of the cavity 101C. The electronic components 160 may be electrically connected to the conductive structures 10A and 10B. In some arrangements, the electronic component 160 may include an active component, a passive component, or other suitable components. For example, the electronic component 160 may be a passive component, such as a capacitor. The capacitor may be a decoupling capacitor or store charges to serve as a spare power supply.

In some arrangements, a coefficient of thermal expansion (CTE) of the filling layer 170 is greater than a CTE of the electronic component 160 and a CTE of the substrate 101. In some arrangements, the electronic component 160 includes a ceramic material (e.g., a ceramic substrate), and the CTE of the filling layer 170 is greater than a CTE of the ceramic material of the electronic component 160. In some arrangements, the CTE of the filling layer 170 is greater than a CTE of the core layer 10C of the substrate 101. In some arrangements, the CTE of the filling layer 170 is about 30 ppm/K. In some arrangements, the CTE of the ceramic material of the electronic component 160 is about 5-6 ppm/K. In some arrangements, the CTE of the core layer 10C is about 10 ppm/K. In some arrangements, the substrate 10 has a non-uniform CTE. Since the CTE distribution within the structure of the substrate 10 is relatively heterogeneous, the thermal expansion within different portions of the substrate 10 may vary, resulting in a distortion or deformation of the profile or the structure of the substrate 10. In some arrangements, the substrate 10 has a wavy surface (e.g., the surface 10a) facing the electronic module 20.

The electronic module 20 may be disposed over the substrate 10. The electronic module 20 may be referred to or include a conductive structure (e.g., an upper conductive structure). In some arrangements, a wiring density of the substrate 10 (or the lower conductive structure) is less than a wiring density of the electronic module 20 (or the upper conductive structure). In some arrangements, the electronic module 20 includes a redistribution layer (RDL) 200, a plurality of solders 250, electronic components 260 and 260A, an encapsulant 270, an underfill 280, a stiffener ring 290, and an adhesive layer 290A. In some arrangements, the electronic components 260 and 260A are disposed over the RDL 200, and the solders 250 electrically connect the electronic components 260 and 260A to the RDL 200. The electronic components 260 and 260A may be active components, passive components, or other suitable components. For example, the electronic component 260 may be an active component, such as a processing component (e.g., ASIC), and the electronic components 260A are memory components (e.g., HBMs). In some arrangements, the stiffener ring 290 is adhered to the RDL 200 through the adhesive layer 290A. In some arrangements, the underfill 280 covers the solders 250. In some arrangements, the encapsulant 270 encapsulates the electronic components 260 and 260A, the solders 250, the underfill 280, the stiffener ring 290, and the adhesive layer 290A. The RDL 200 may include a dielectric structure 220 and a plurality of conductive traces, conductive vias, and/or conductive pads (e.g., one or more conductive pads 210) formed or disposed in the dielectric structure 220. The dielectric structure 220 may include a plurality of dielectric layers. The RDL 200 may be or include a wiring structure. The RDL 200 (or the wiring structure) may be disposed over the substrate 10. The encapsulant 270 and the underfill 280 may independently include an epoxy resin having fillers, a molding compound (e.g., an epoxy molding compound or other molding compound), polyimide, a phenolic compound or material, a material with a silicone dispersed therein, or a combination thereof.

In some arrangements, an equivalent CTE of the RDL 200 is greater than a CTE of the electronic components 260 and/or 260A. In some arrangements, the electronic module 20 includes a bent structure having a curved surface (e.g., surface 20a) facing the substrate 10. In some arrangements, the curved surface (e.g., the surface 20a) of the electronic module 20 is facing and bonded to the wavy surface (e.g., the surface 10a) of the substrate 10. In some arrangements, a heat-resistant temperature of the electronic component 160 is less than a melting point of the solders 250.

The attachment structure 30 may be disposed between the substrate 10 and the electronic module 20. In some arrangements, the attachment structure 30 is between the RDL 200 (or the wiring structure) and the substrate 10. In some arrangements, the attachment structure 30 includes a filling layer 40 and a wire bundle structure. The wire bundle structure may include a plurality of wires 50. The wire bundle structure may be or include a nanowire bundle structure including a plurality of nanowires (e.g., the wires 50). The wire bundle structure (e.g., the wires 50) may be disposed between the substrate 10 and the electronic module 20. In some arrangements, the wire bundle structure (or the wires 50) is between the RDL 200 (or the wiring structure) and the substrate 10. In some arrangements, the wire bundle structure (or the wires 50) electrically connects the electronic module 20 to the substrate 10.

In some arrangements, the filling layer 40 connects the electronic module 20 to the substrate 10. In some arrangements, the filling layer 40 is between the electronic module 20 (or the upper conductive structure) and the substrate 10 (or the lower conductive structure). In some arrangements, the filling layer 40 is or includes an insulative layer. In some arrangements, the filling layer 40 is or includes an adhesive structure. In some arrangements, the filling layer 40 is or includes an insulative adhesive layer. In some arrangements, the filling layer 40 is or includes a non-conductive film (NCF), a non-conductive paste (NCP), a liquid crystal polymer adhesive, PI, or a combination thereof. In some arrangements, the filling layer 40 is or includes a monolithic layer. In some arrangements, the filling layer 40 is formed of a B stage adhesive. In some arrangements, the filling layer 40 includes an underfill.

In some arrangements, the wires 50 are configured to attach the electronic module 20 to the substrate 10 to mitigate a warpage of the electronic module 20 (e.g., the bent structure). In some arrangements, at least some of the wires 50 are formed on the conductive pad 210 of the RDL 200, and at least some of the wires 50 are formed on the conductive pad 110 of the substrate 10, such that the wires 50 from the conductive pad 210 tangle with the wires 50 from the conductive pad 110 to fix the relative position of the electronic module 20 and the substrate 10 in a vertical direction (e.g., in a direction from the substrate 10 to the electronic module 20). As such, although the filling layer 40 is unable to reduce or mitigate a warpage of the electronic module 20 in the manufacturing process before the filling layer 40 is cured, the substrate 10 having a relatively high rigidity can provide structural support and thus reduce a warpage of the electronic module 20 during the manufacturing process before the filling layer 40 is cured. In some arrangements, the wire bundle structure is configured to reduce a variation in a distance of a gap between the substrate 10 and the RDL 200 (or the wiring structure). In some arrangements, the wires 50 penetrate the filling layer 40. In some arrangements, the wires 50 electrically connect the conductive pad 110 to the conductive pad 210. In some arrangements, the wires 50 are interlocked with the filling layer 40 and configured to confine the filling layer 40 within a coverage of the electronic module 20. The coverage of the electronic module 20 may refer to a projection of the surface 20a on the surface 10a of the substrate 10. In some arrangements, the attachment structure 30 is in the filling layer 40 and configured to reduce the filling layer 40 from overflowing out of the package structure. In some arrangements, the wires 50 are configured to prevent the filling layer 40 from overflowing outward from a space between the electronic module 20 and the substrate 10. In some arrangements, the filling layer 40 is formed of a B stage adhesive, and the wires 50 are configured to prevent the B stage adhesive from overflowing outward from a space between the electronic module 20 and the substrate 10 in a bonding operation prior to curing the B stage adhesive. In some arrangements, the wires 50 are nanowires. In some arrangements, the wires 50 are conductive nanowires. In some arrangements, the wires 50 are one or more bundles of conductive nanowires (also referred to as "conductive nanowire bundles")

In some arrangements, the wires 50 include a plurality of wires 510 (also referred to as "first wires" or "a first wire bundle") extending from a pad of the substrate 10 and a plurality of wires 520 (also referred to as "second wires" or "a second wire bundle") extending from a pad of the RDL 200 of the electronic module 20. In some arrangements, the wires 510 are formed as a wire bundle (e.g., a bundle of nanowires). In some arrangements, the wires 520 are formed as a wire bundle (e.g., a bundle of nanowires). In some arrangements, the first wire bundle (e.g., the wires 510) is formed on the pad (e.g., the conductive pad 110) of the substrate 10, and the second wire bundle (e.g., the wires 520) is formed on the pad (e.g., the conductive pad 210) of the RDL 200. In some arrangements, a portion of the wires 510 contacts a portion of the wires 520. In some arrangements, the wires 50 include a tangled portion 50A between the substrate 10 and the electronic module 20. In some arrangements, the tangled portion 50A is separated from the substrate 10 and the electronic module 20. In some arrangements, the tangled portion 50A includes a portion of the wires 510 and a portion of the wires 520 that contact each other. In some arrangements, at least some of the wires 510 are spaced apart from the electronic module 20, and at least some of wires 520 are spaced apart from the substrate 10. In some arrangements, the tangled portion 50A of the wires 50 is interlocked with the filling layer 40. In some arrangements, the filling layer 40 extends between the wires 50. In some arrangements, the filling layer 40 extends along the tangled portion 50A.

In some arrangements, the package structure 1 further includes a plurality of seed layers 150, and the wires 50 are formed or disposed on the seed layers 150. In some arrangements, at least some of the wires 510 are spaced apart from the seed layers 150 on the electronic module 20, and at least some of wires 520 are spaced apart from the seed layers 150 on the substrate 10.

In some arrangements, the package structure 1 may further include a carrier 10S, and the bonded structure including the substrate 10 and the electronic module 20 is connected to the carrier 10S through the electrical contacts 80. The carrier 10S may include, for example, a printed circuit board, such as a paper-based copper foil laminate, a composite copper foil laminate, or a polymer-impregnated glass-fiber-based copper foil laminate. The carrier 10S may include an interconnection structure, which may include such as a plurality of conductive traces and/or a plurality of conductive vias. The interconnection structure may include a redistribution layer (RDL) and/or a grounding element. In some arrangements, the carrier 10S may include a substrate, such as an organic substrate or a leadframe. In some arrangements, the electrical contacts 80 may include solder balls or solder bumps. In some arrangements, the electrical contacts 80 may include controlled collapse chip connection (C4) bumps, a ball grid array (BGA) or a land grid array (LGA).

Figure 2A:
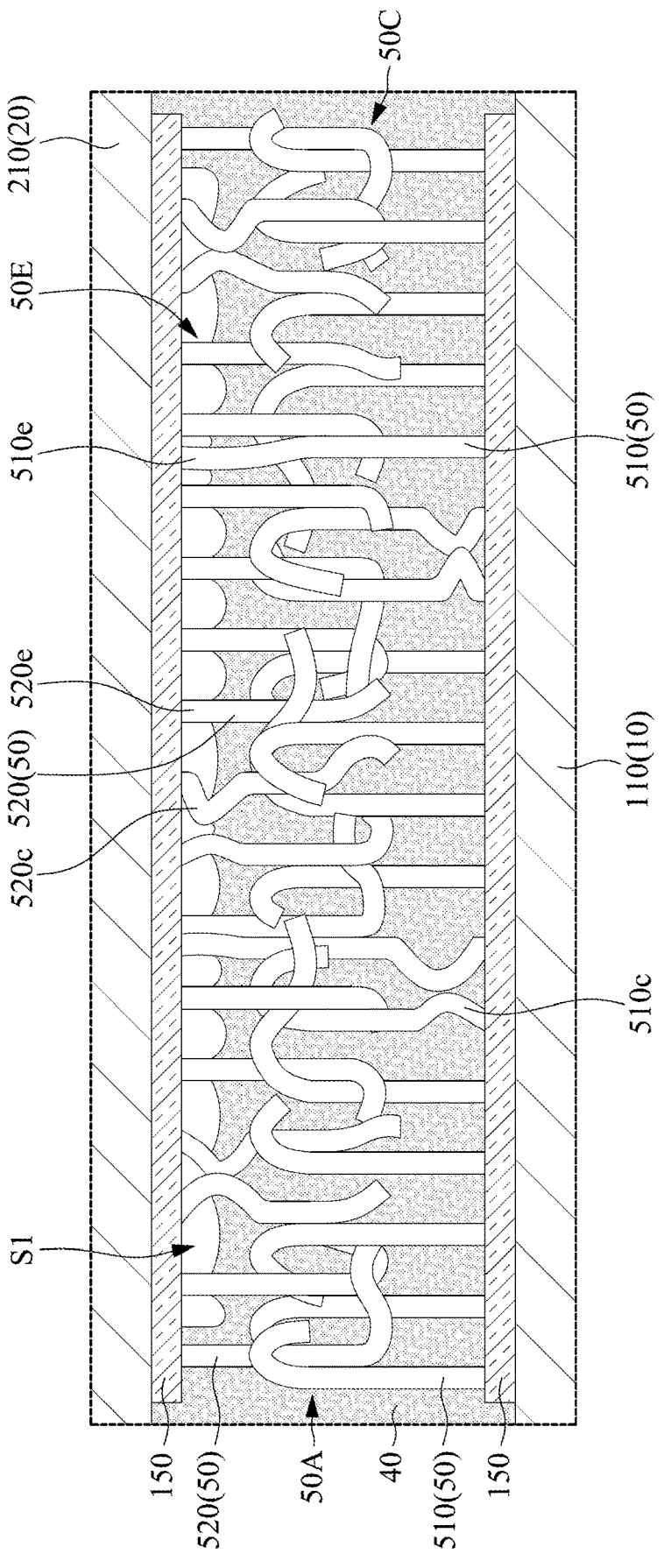
FIG. 2A is a cross-section of a portion of a package structure in accordance with some arrangements of the present disclosure.

FIG. 2A is a cross-section of a portion of a package structure in accordance with some arrangements of the present disclosure. In some arrangements, FIG. 2A is a cross-section of a portion 2A of the package structure 1 in FIG. 1 in accordance with some arrangements of the present disclosure.

In some arrangements, the wires 50 have a portion 50E (also referred to as "an end portion") that is spaced apart from the filling layer 40. In some arrangements, the portion 50E is exposed to a gap S1 (or an air space) defined by the filling layer 40 and a surface (e.g., the surface 20a) of the electronic module 20. In some arrangements, the portion 50E includes a plurality of end portions 520e of the wires 520. In some arrangements, the portion 50E further includes a plurality of end portions 510e of the wires 510. In some arrangements, the wires 50 include a portion 50C contacting or covered by the filling layer 40 and a portion (e.g., the portion 50E) free from contacting or being covered by the filling layer 40. In some arrangements, the portion 50E is proximal to the RDL 200 and distal from the substrate 10. In some arrangements, the portion 50C includes a plurality of portions of the wires 510 and a plurality of portions of the wires 520. In some arrangements, the portion 50C that is covered by the filling layer 40 may include the tangled portion 50A.

In some arrangements, the wires 510 include curved portions 510c connected to the substrate 10. In some arrangements, the wires 520 include curved portions 520c connected to the electronic module 20. In some arrangements, the tangled portion 50A is closer to the conductive pad 110 than to the conductive pad 210.

Figure 2B:
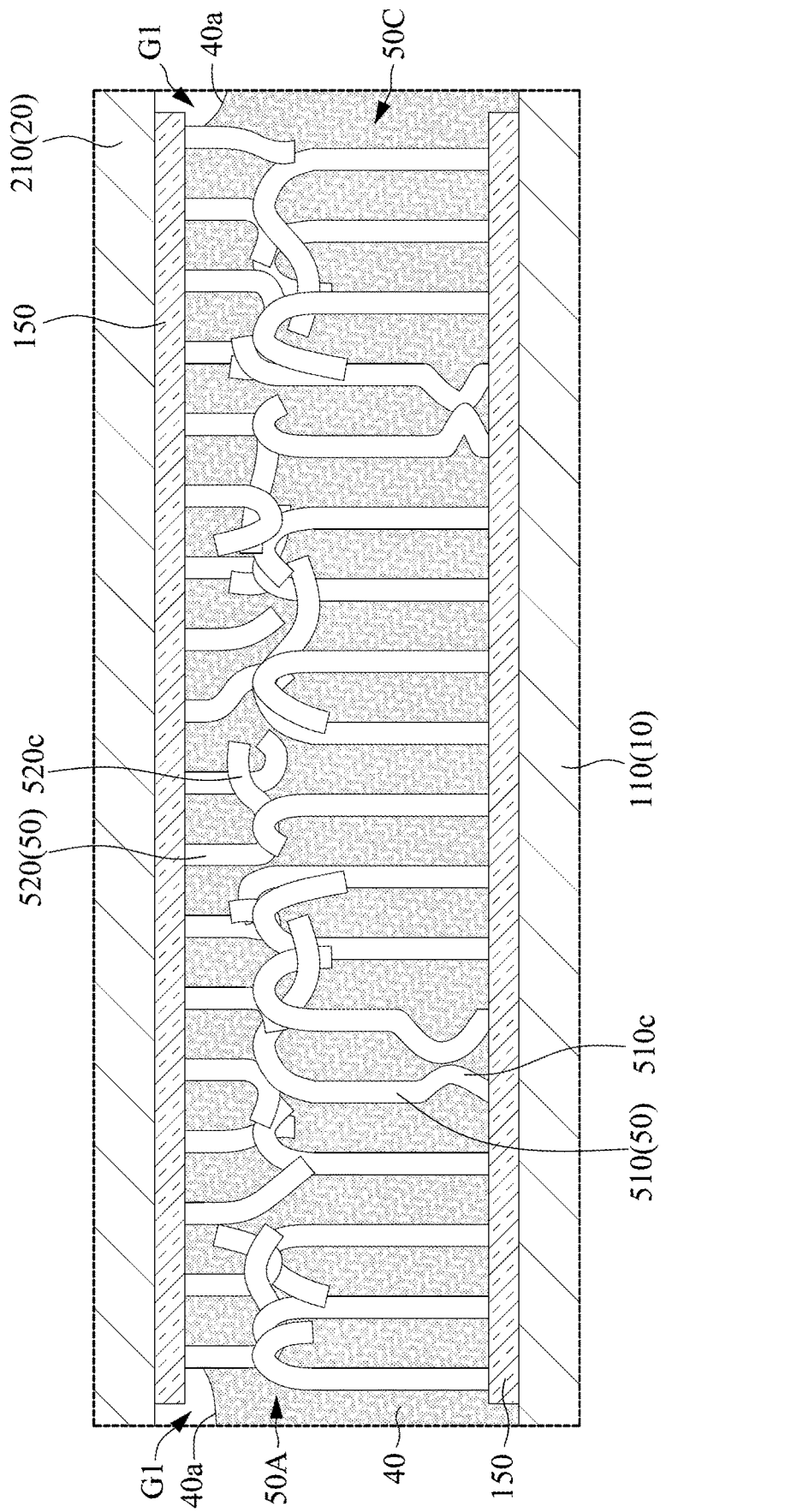
FIG. 2B is a cross-section of a portion of a package structure in accordance with some arrangements of the present disclosure.

FIG. 2B is a cross-section of a portion of a package structure in accordance with some arrangements of the present disclosure. In some arrangements, FIG. 2B is a cross-section of a portion 2A of the package structure 1 in FIG. 1 in accordance with some arrangements of the present disclosure. The structure illustrated in FIG. 2B is similar to that in FIG. 2A, and the differences therebetween are described as follows.

In some arrangements, a portion of a surface 40a (or an upper surface) of the filling layer 40 is spaced apart from the electronic module 20 by a gap G1 (or an air space). In some arrangement, the surface 40a includes a curved surface recessed toward the substrate 10. In some arrangements, at least one of the wires 50 is partially covered by the filling layer 40 and partially exposed to the gap G1. In some arrangements, the gap G1 is free from overlapping the wires 50 in a vertical direction (i.e., a direction from the electronic module 20 to the substrate 10). In some arrangements, the gap G1 is partially overlapping the wires 50 in a vertical direction (i.e., a direction from the electronic module 20 to the substrate 10).

In some arrangements, the wires 520 are shorter than the wires 510. In some arrangements, at least some of the wires 520 are covered by the filling layer 40. In some arrangements, the tangled portion 50A is closer to the electronic module 20 than to the substrate 10.

Figure 2C:
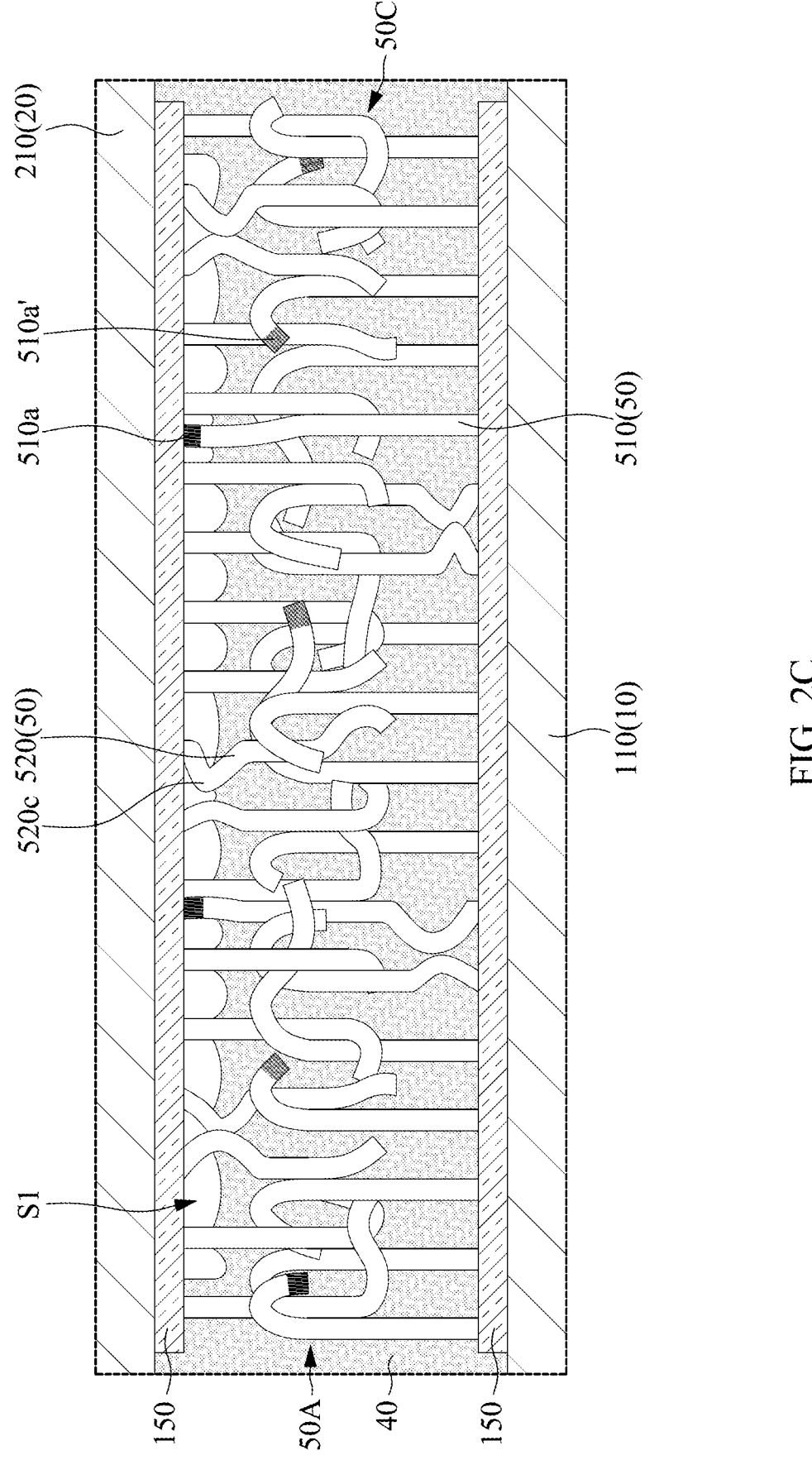
FIG. 2C is a cross-section of a portion of a package structure in accordance with some arrangements of the present disclosure.

FIG. 2C is a cross-section of a portion of a package structure in accordance with some arrangements of the present disclosure. In some arrangements, FIG. 2C is a cross-section of a portion 2A of the package structure 1 in FIG. 1 in accordance with some arrangements of the present disclosure. The structure illustrated in FIG. 2C is similar to that in FIG. 2A, and the differences therebetween are described as follows.

In some arrangements, the wires 510 include a plurality of oxidized end portions 510a and 510a'. In some arrangements, the oxidized end portions 510a' (also referred to as "first oxidized end portions") are covered by the filling layer 40, and the oxidized end portions 510a (also referred to as "second oxidized end portions") are exposed by the filling layer 40. In some arrangements, the oxidized end portions 510a are exposed to the gap S1 (or the air space).

Figure 2D:
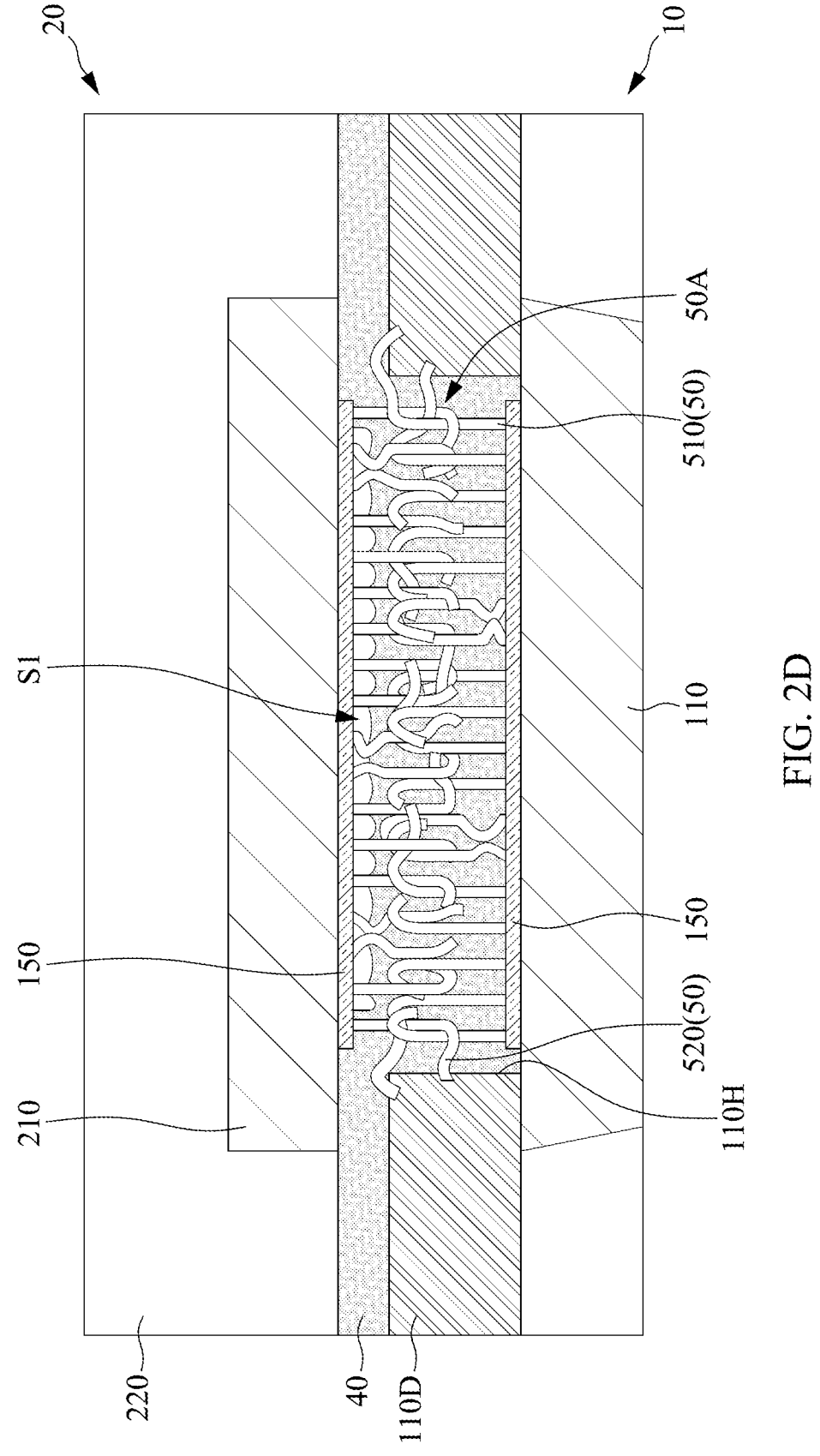
FIG. 2D is a cross-section of a portion of a package structure in accordance with some arrangements of the present disclosure.

FIG. 2D is a cross-section of a portion of a package structure in accordance with some arrangements of the present disclosure. In some arrangements, FIG. 2D is a cross-section of a portion 2A of the package structure 1 in FIG. 1 in accordance with some arrangements of the present disclosure. The structure illustrated in FIG. 2D is similar to that in FIG. 2A, and the differences therebetween are described as follows.

In some arrangements, the dielectric structure 10D of the substrate 10 defines a recess 110H recessed from the surface 10a (or the upper surface) of the substrate 10, and a portion of the filling layer 40 encapsulates a portion of the wires 50 and extends into the recess 110H. In some arrangements, the dielectric structure 10D includes a dielectric layer 110D, and the dielectric layer 110D has an opening (e.g., the recess 110H) that exposes the conductive pad 110. In some arrangements, the tangled portion 50A is at least partially within the opening (or the recess 110H). In some arrangements, the tangled portion 50A is closer to the substrate 10 than to the electronic module 20. In some arrangements, the wires 50 are partially within the opening (or the recess 110H).

In some arrangements at least one of the wires 50 of the wire bundle structure protrudes outwards from a region between the pad 110 and the pad 210. In some arrangements, at least one of the wires 50 contacts the dielectric layer 110D. In some arrangements, at least one of the wires 50 extends into the dielectric layer 110D. In some arrangements, at least an end portion of a wire 510 or 520 from the tangled portion 50A extends into the dielectric layer 110D. In some arrangements, the end portion of the wire 510 and/or the end portion of the wire 520 may extend into the dielectric layer 110D from an inner sidewall of the recess 110H. In some arrangements, the end portion of the wire 510 and/or the end portion of the wire 520 may extend into the dielectric layer 110D from an upper surface of the dielectric layer 110D.

Figure 2E:
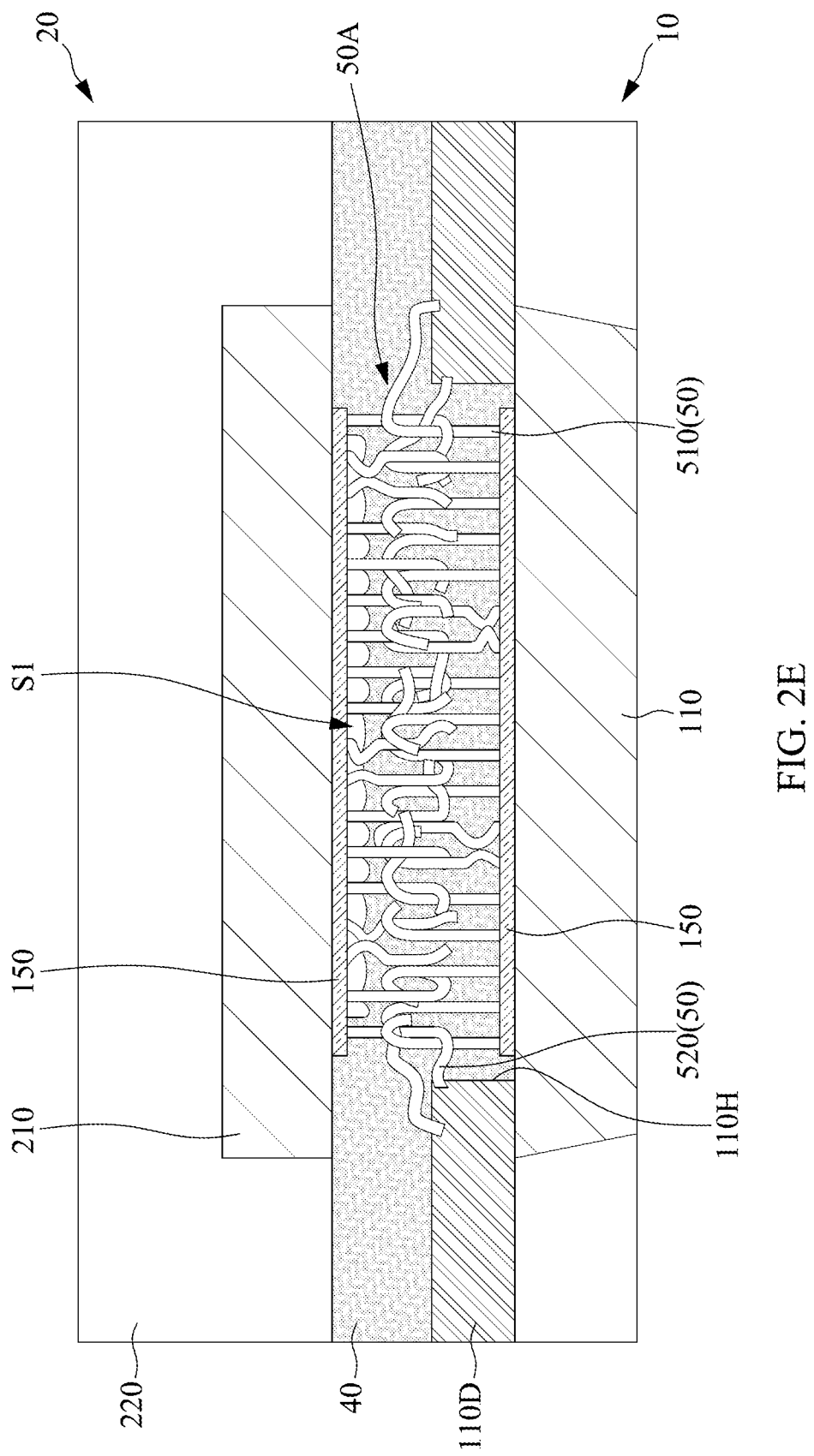
FIG. 2E is a cross-section of a portion of a package structure in accordance with some arrangements of the present disclosure.

FIG. 2E is a cross-section of a portion of a package structure in accordance with some arrangements of the present disclosure. In some arrangements, FIG. 2E is a cross-section of a portion 2A of the package structure 1 in FIG. 1 in accordance with some arrangements of the present disclosure. The structure illustrated in FIG. 2E is similar to that in FIG. 2D, and the differences therebetween are described as follows.

In some arrangements, the tangled portion 50A is closer to the electronic module 20 than to the substrate 10. In some arrangements, the tangled portion 50A is mostly above the recess 110H.

Figure 2F:
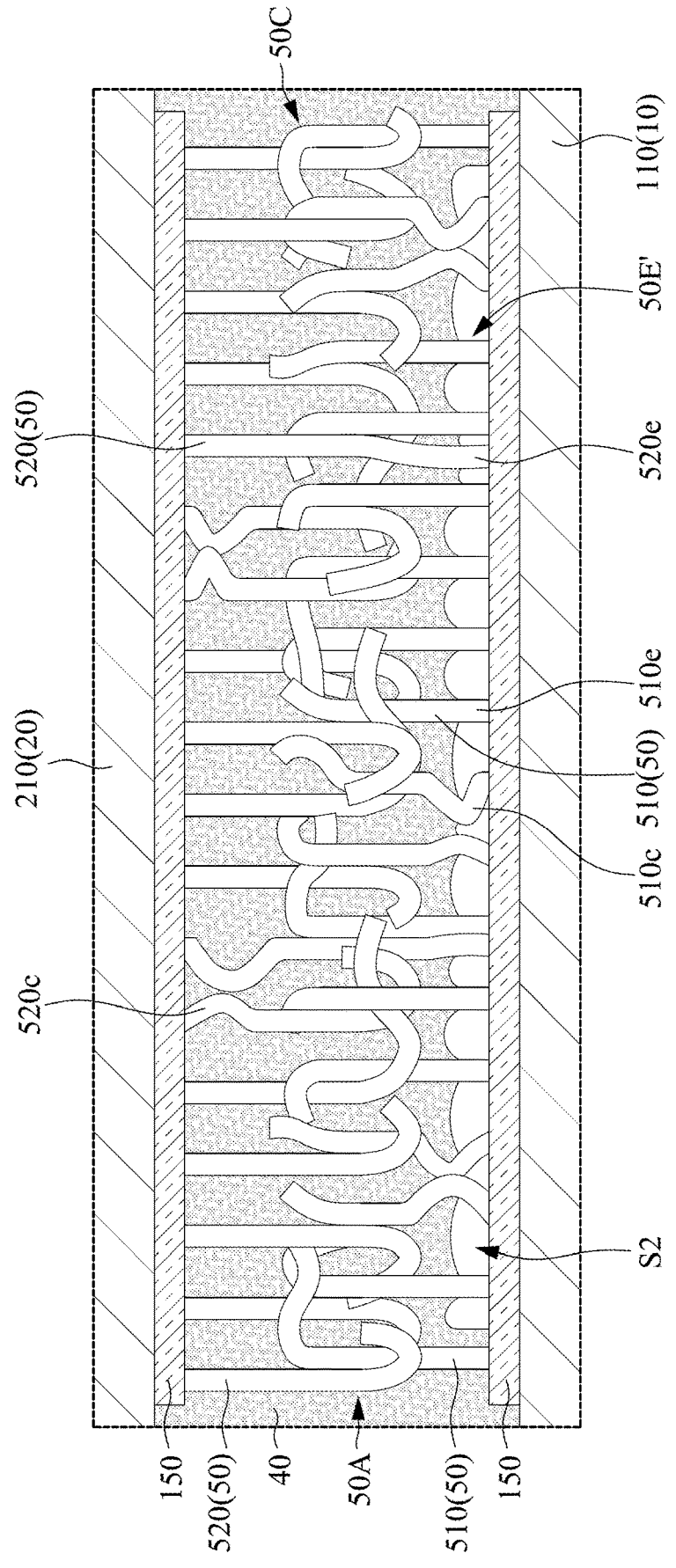
FIG. 2F is a cross-section of a portion of a package structure in accordance with some arrangements of the present disclosure.

FIG. 2F is a cross-section of a portion of a package structure in accordance with some arrangements of the present disclosure. In some arrangements, FIG. 2F is a cross-section of a portion 2A of the package structure 1 in FIG. 1 in accordance with some arrangements of the present disclosure. The structure illustrated in FIG. 2F is similar to that in FIG. 2A, and the differences therebetween are described as follows.

In some arrangements, the wires 50 have a portion 50E' (also referred to as "an end portion") that is spaced apart from the filling layer 40. In some arrangements, the portion 50E' is exposed to a gap S2 (or an air space) defined by the filling layer 40 and a surface (e.g., the surface 10a) of the substrate 10. In some arrangements, the portion 50E' of the wires 50 is closer to the substrate 10 than to the electronic module 20. In some arrangements, the portion 50E' includes a plurality of end portions 520e of the wires 520. In some arrangements, the portion 50E' further includes a plurality of end portions 510e of the wires 510. In some arrangements, the wires 50 include a portion 50C covered by the filling layer 40 and a portion (e.g., the portion 50E') free from being covered by the filling layer 40. In some arrangements, the portion 50C includes a plurality of portions of the wires 510 and a plurality of portions of the wires 520. In some arrangements, the portion 50C that is covered by the filling layer 40 may include the tangled portion 50A.

Figure 3:
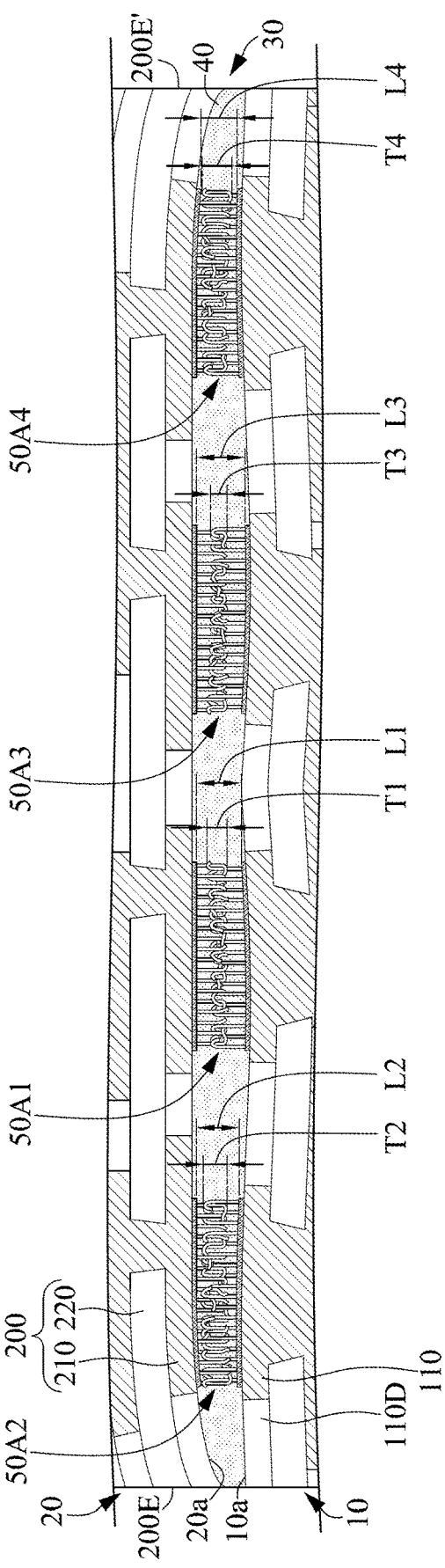
FIG. 3 is a cross-section of a package structure in accordance with some arrangements of the present disclosure.

FIG. 3 is a cross-section of a portion of a package structure in accordance with some arrangements of the present disclosure. In some arrangements, FIG. 3 is a cross-section of a portion of the package structure 1 in FIG. 1 in accordance with some arrangements of the present disclosure.

In some arrangements, the substrate 10 has a wavy surface (e.g., the surface 10a) facing the electronic module 20. In some arrangements, the electronic module 20 includes a bent structure having a curved surface (e.g., surface 20a) facing the substrate 10. In some arrangements, a distance between the surface 10a and the surface 20a is non-uniform. In some arrangements, the distance between the surface 10a and the surface 20a increases from a center region towards a peripheral region of the package structure as shown in FIG. 3.

In some arrangements, the wires 50 include a plurality of tangled portions (e.g., tangled portions 50A1, 50A2, 50A3, and 50A4). In some arrangements, the wires 510 (or the first wire bundle) contact the wires 520 (or the second wire bundle) to form the tangled portions 50A1, 50A2, 50A3, and 50A4. In some arrangements, the tangled portions 50A1, 50A2, 50A3, and 50A4 are spaced apart from one another. In some arrangements, the wires 50 include a plurality of connection portions each including one of the tangled portions 50A1, 50A2, 50A3, and 50A4. In some arrangements, the connection portions of the wires 50 are separated from each other by portions of the filling layer 40.

In some arrangements, a thickness T1 of the tangled portion 50A1 is less than a thickness T2 of the tangled portion 50A2. In some arrangements, a length L1 of the wires 50 including the tangled portion 50A1 is greater than a length L2 of the wires 50 including the tangled portion 50A2. In some arrangements, the tangled portion 50A2 is closer to an edge 200E of the RDL 200 than the tangled portion 50A1 is. In some arrangements, the thickness T2 of the tangled portion 50A2 increases toward the edge 200E of the RDL 200. In some arrangements, the length L2 of the wires 50 including the tangled portion 50A2 increases toward the edge 200E of the RDL 200. In some arrangements, the lengths L1 and L2 are equal to or less than about 6 μm, 4 μm, or 2 μm.

In some arrangements, a thickness T3 of the tangled portion 50A3 is less than a thickness T4 of the tangled portion 50A4. In some arrangements, a length L3 of the wires 50 including the tangled portion 50A3 is greater than a length L4 of the wires 50 including the tangled portion 50A4. In some arrangements, the tangled portion 50A4 is closer to an edge 200E' of the RDL 200 than the tangled portion 50A3 is. In some arrangements, the thickness T4 of the tangled portion 50A4 increases toward the edge 200E' of the RDL 200. In some arrangements, the length L4 of the wires 50 including the tangled portion 50A4 increases toward the edge 200E' of the RDL 200. In some arrangements, the lengths L3 and L4 are equal to or less than about 6 μm, 4 μm, or 2 μm.

In some cases where the electronic module 20 is bonded to the substrate 10 through solders, the solders may increase the resistance of the electrical path between the electronic module 20 and the substrate 10, and thus the electrical performance of the package structure 1 may be less satisfactory. In addition, in some cases where the electronic module 20 and the substrate 10 are both bent or warped, solder joints that connect the electronic module 20 to the substrate 10 may crack due to the non-uniform distance between the surface 20a of the electronic module 20 and the surface 10a of the substrate 10, and thus the yield may be decreased. Moreover, in some cases where hybrid bonding structures may be used to bond the electronic module 20 and the substrate 10; however, additional planarization operations are required to form planarized bonding surfaces for the electronic module 20 and the substrate 10. Furthermore, in some cases where the electronic module 20 includes electronic components 260 and 260A that are bonded to the RDL 200 through the solders 250 by a reflow operation; therefore, if the reflow temperature for the solders between the electronic module 20 and the substrate 10 is higher than the melting point of the solders 250, the solders 250 may melt, and the electronic module 20 may be damaged by the reflow operation, thus the yield is decreased.

According to some arrangements of the present disclosure, the electronic module 20 is bonded to the substrate 10 through the wires 50, solder bumps or solder pastes are not required for bonding the electronic module 20 to the substrate 10, and thus reflow operations are not required for bonding the electronic module 20 to the substrate 10. Therefore, the order of reflow operations can be disregarded, since bonding structures formed of wires do not melt under thermal operations. Accordingly, the flexibility of the manufacturing process is increased, and the yield can be increased as well.

In addition, according to some arrangements of the present disclosure, the tangled portion 50A of the wires 50 is interlocked with the filling layer 40, and thus the structural strength of the package structure 1 is increased. Therefore, the reliability of the package structure 1 is increased.

Moreover, according to some arrangements of the present disclosure, the wires 510 are tangled with the wires 520, the relative position of the wires 510 to the wires 520 can be fixed, and a pulling strength in a vertical direction (i.e., in a direction from the substrate 10 toward the electronic module 20) can be provided between the electronic module 20 and the substrate 10. Therefore, the electronic module 20 may have a reduced warpage due to being pulled toward the substrate 10 by the tangled wires 510 and 520. Moreover, since the electronic module 20 and the substrate 10 are pulled toward each other through the tangled wires 510 and 520, even with the distance between the surface 20a of the electronic module 20 and the surface 10a of the substrate 10 being non-uniform, the pulling strength provided by the tangled wires 510 and 520 can provide relatively sufficient bonding strength between the electronic module 20 and the substrate 10. Therefore, the yield can be increased, and the reliability of the package structure 1 can be increased as well. In addition, additional planarization operations are not required when the electronic module 20 is bonded to the substrate 10 through the wires 510 and 520, and thus the manufacturing process is simplified.

Furthermore, according to some arrangements of the present disclosure, wires 50 (e.g., wires 510 and 520) are used to replace solders for bonding the electronic module 20 to the substrate 10, the length of the wires 50 is less than a height of a solder ball or a solder bump. Since the distance between the electronic module 20 and the substrate 10 may be defined by the length of the wires 50 or the height of the solder ball or the solder bump, the overall thickness of the package structure 1 using wires 50 instead of solders for bonding can be reduced, and thus the size of the package structure 1 can be reduced.

Moreover, according to some arrangements of the present disclosure, with the wires 50 vertically electrically connecting the electronic components 160 and 260, the wires 50 provide a one-dimensional transmission path in a vertical direction between the substrate 10 and the electronic module 20, such that the transmission efficiency (e.g., power transmission efficiency of the electronic component 160 serving as a spare power supply) can be increased.

FIG. 4A, FIG. 4B, FIG. 4C, FIG. 4D, FIG. 4E, FIG. 4F, FIG. 4G, and FIG. 4H illustrate various stages of an example of a method for manufacturing a package structure 1 in accordance with some arrangements of the present disclosure.

Figure 4A:
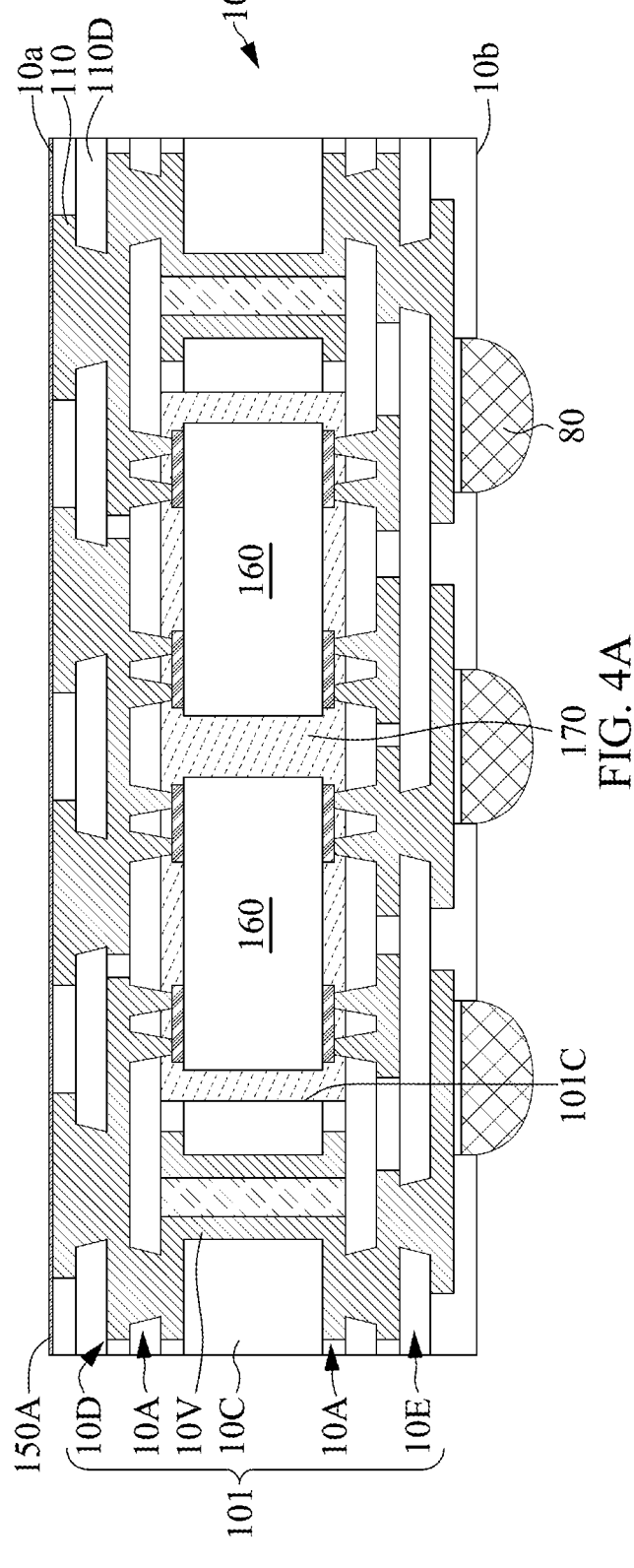
FIG. 4A, FIG. 4B, FIG. 4C, FIG. 4D, FIG. 4E, FIG. 4F, FIG. 4G, and FIG. 4H illustrate various stages of an example of a method for manufacturing a package structure in accordance with some arrangements of the present disclosure.

Referring to FIG. 4A, a substrate 10 including a substrate 101, electronic components 160 embedded in the substrate 101, and a filling layer 170 filled in one or more gaps between the electronic components 160 and the substrate 101 may be provided. Electrical contacts 80 may be disposed on a surface 10b (or a bottom surface) of the substrate 10. A seed layer 150A may be formed on a surface 10a (or a top surface) of the substrate 10. The seed layer 150A may be formed by plating. The seed layer 150A may include Ti/Cu. In some arrangements, the substrate 101 includes a core layer 10C, conductive structures 10A and 10B disposed on opposite surfaces (e.g., an upper surface and a bottom surface) of the core layer 10C, and dielectric structures 10D and 10E disposed on opposite surfaces of the core layer 10C. In some arrangements, the substrate 101 further includes one or more conductive vias 10V penetrating the core layer 10C to electrically connect the conductive structures 10A and 10B. In some arrangements, the electronic components 160 are disposed in a cavity 101C of the substrate 10, and the filling layer 170 is filled in the cavity 101C.

Figure 4B:
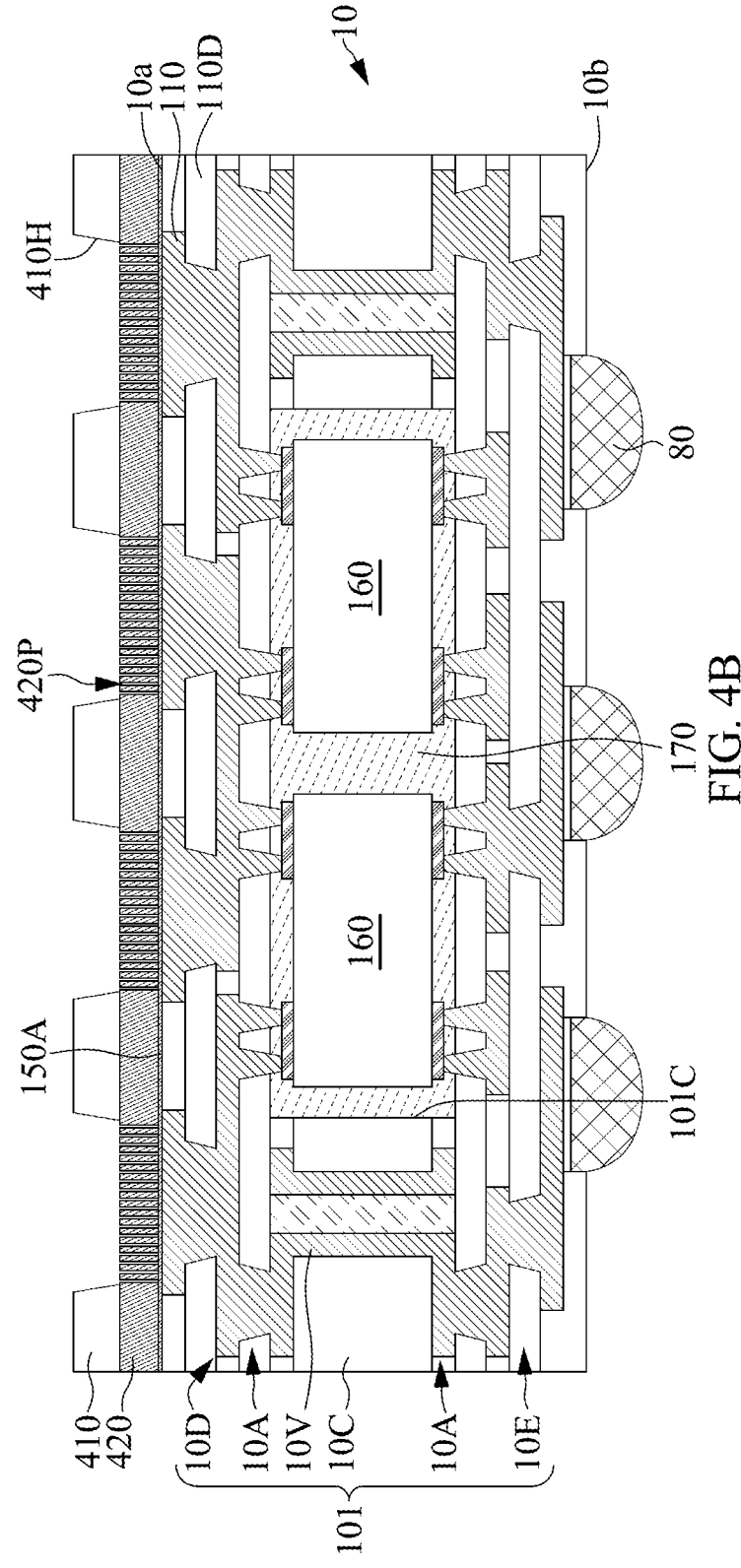

Referring to FIG. 4B, a metal substrate may be formed on the seed layer 150A, a photoresist 410 may be disposed on the metal substrate, and pores 420P may be formed in regions of the metal substrate exposed from opening 410H of the photoresist 410, so as to form a porous structure 420. The metal substrate may be formed on the seed layer 150A by sputtering. In some arrangements, the metal substrate may be or include an aluminum substrate. In some arrangements, the pores may be formed by an electrochemical technique, such as anodizing technique. The porous structure 420 may be referred to as an anodic aluminum oxide (AAO) substrate.

Figure 4C:
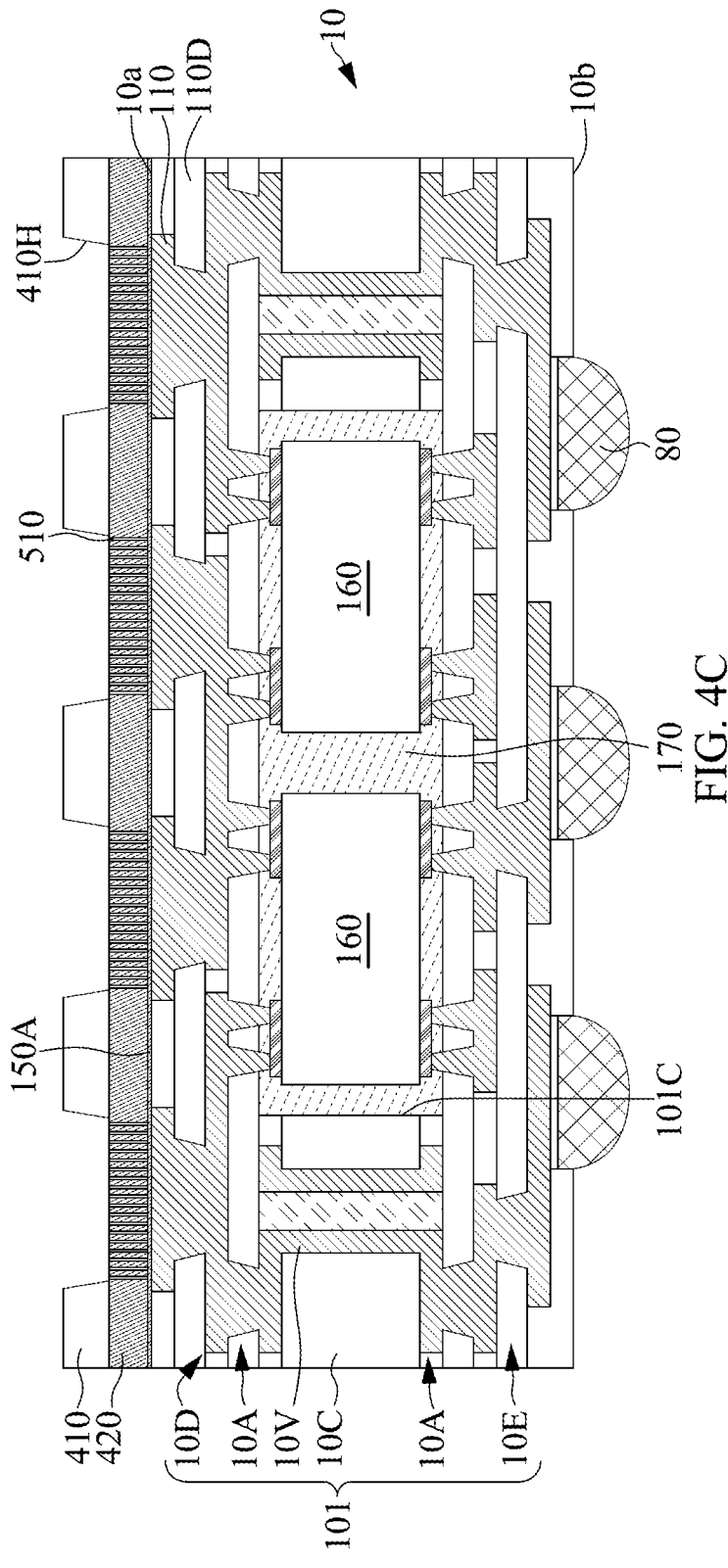

Referring to FIG. 4C, wires 510 may be formed in the pores 420P of the porous structure 420. The wires 510 may be formed by plating. The wires 510 may include a metal material, such as copper (Cu) or other suitable metal materials.

Figure 4D:
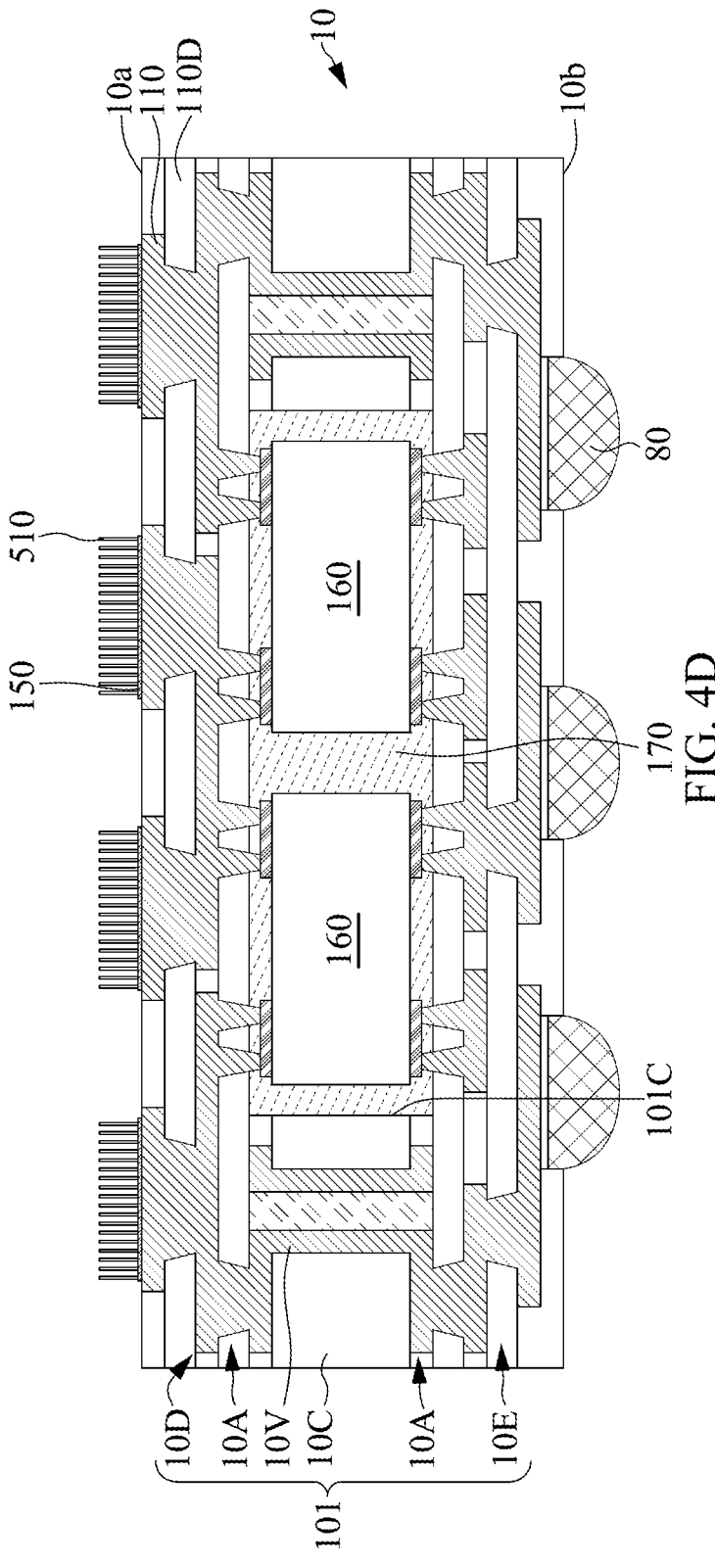

Referring to FIG. 4D, the photoresist 410 and the porous structure 420 may be removed. An acid solution or other suitable solutions may be utilized to remove the photoresist 410 and the porous structure 420. In some arrangements, portions of the seed layer 150A under the photoresist 410 are removed to form a plurality of seed layers 150 between the wires 510 and the substrate 10.

Figure 4E:
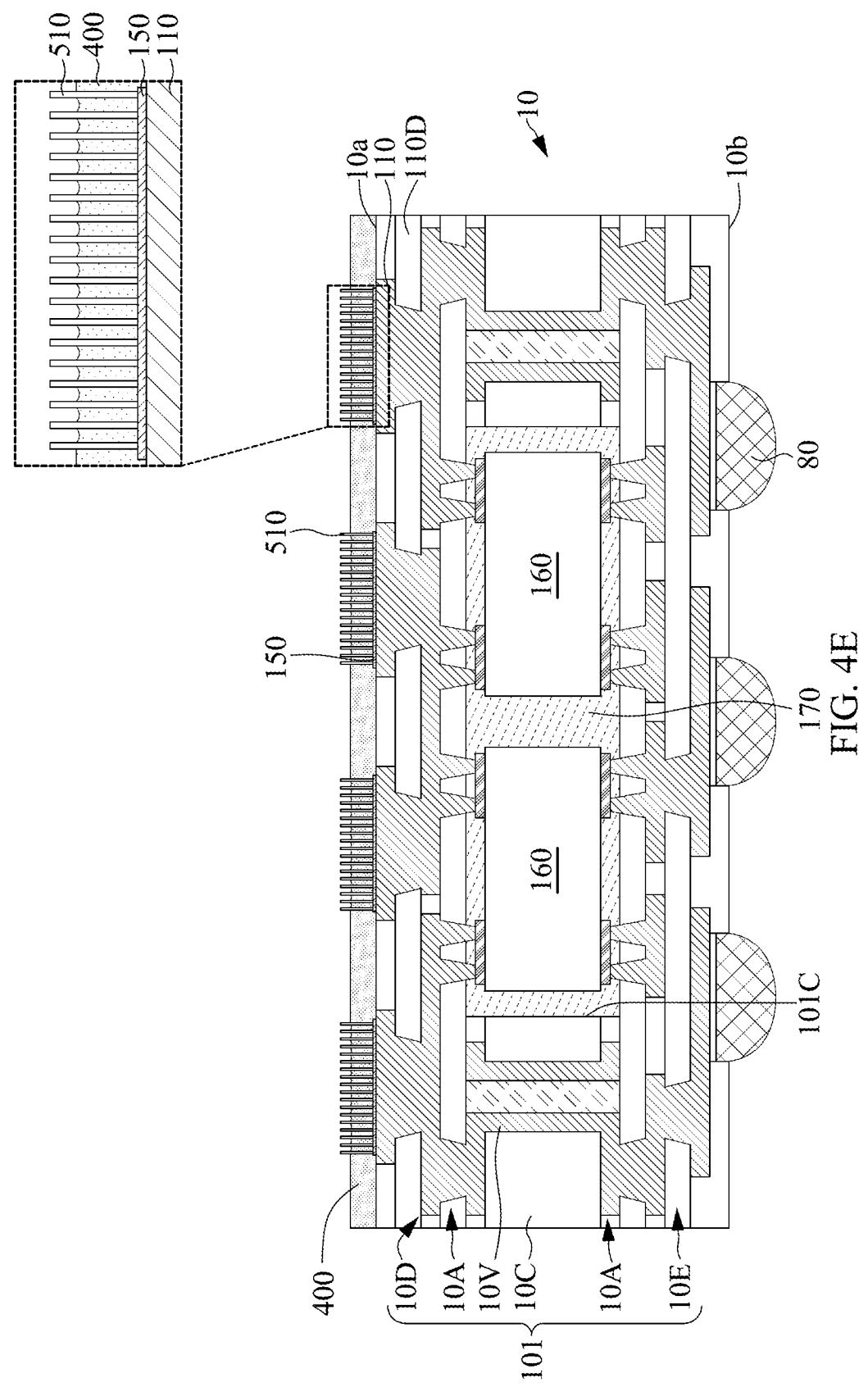

Referring to FIG. 4E, a filling material 400 may be applied over the surface 10a of the substrate 10 and at least partially covering the wires 510. In some arrangements, end portions 510e of the wires 510 are exposed from or uncovered by the filling material 400. In some arrangements, the filling material 400 fills gaps between the wires 510. In some arrangements, the filling material 400 is or includes a material (e.g., a B stage adhesive) which has a relatively high flowability as compared to a molding compound (e.g., an epoxy resin, an epoxy molding compound, or the like). The filling material 400 may be or include an adhesive material. While a molding compound may have a relatively low flowability and cannot fill gaps between the wires 510, the filling material 400 having a relatively high flowability can fill the gaps between the wires 510. In some arrangements, the filling material 400 extends into gaps between the wires 510 and contacts surfaces of the seed layers 150 exposed by the wires 510. In some arrangements, the wires 510 penetrate the filling material 400 and are configured to prevent the filling material 400 from overflowing outward from the surface 10a of the substrate 10. Due to the capillary force between the filling material 400 and the wires 510, the filling material 400 may adhere to sidewalls of the wires 510, and thus the filling material 400 does not overflow outwards from the surface 10a of the substrate 10. In some arrangements, portions of the filling material 400 are inserted or locked in the gaps between the wires 510. In some arrangements, the exposed end portions 510e of the wires 510 may be oxidized to form oxidized end portions (please refer to FIG. 2C for an as-formed structure including the oxidized end portions).

Figure 4F:
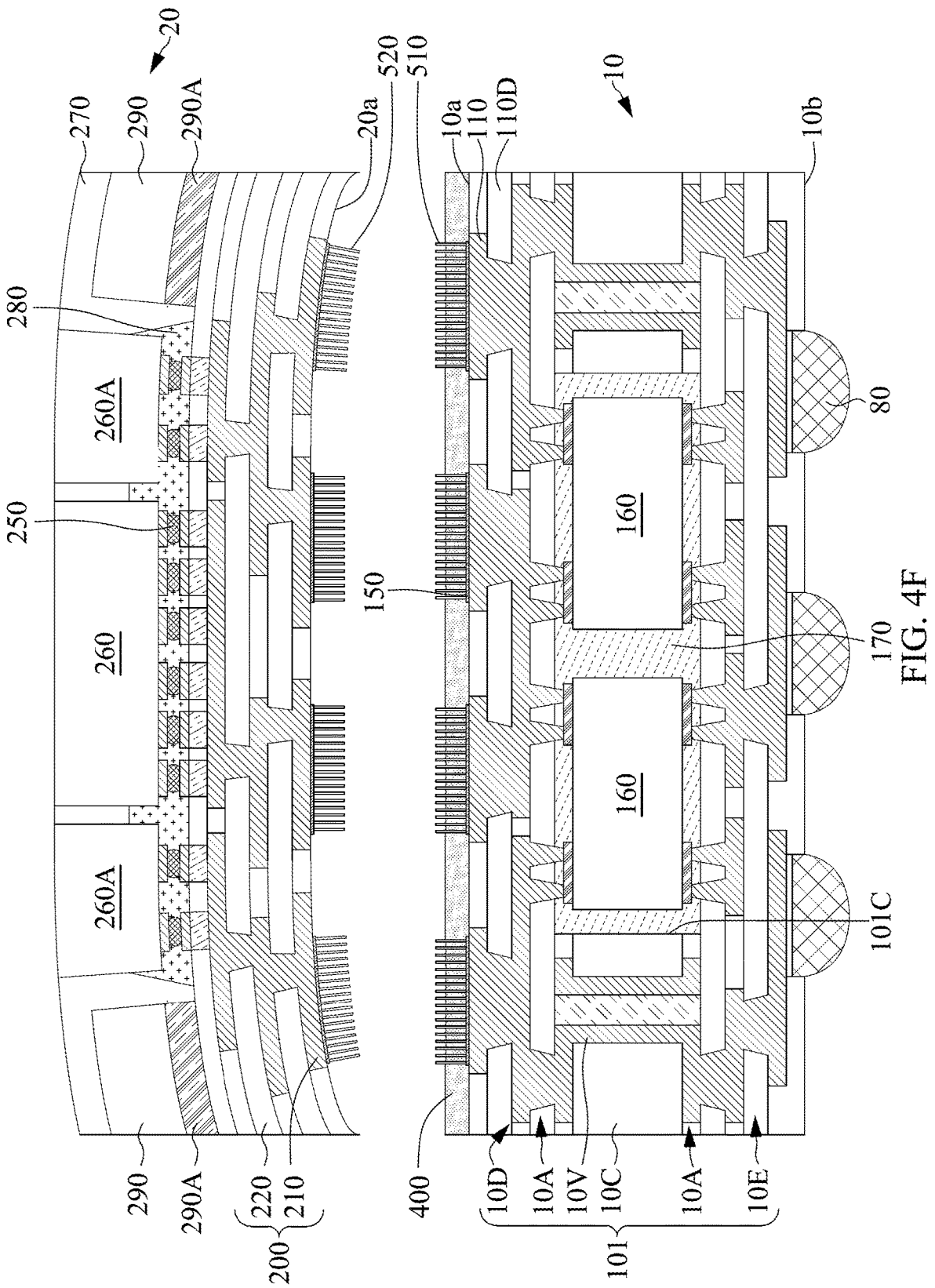

Referring to FIG. 4F, an electronic module 20 may be provided, seed layers 150 may be formed on the surface 20a of the electronic module 20, and wires 520 may be formed on the seed layers 150. The seed layers 150 and the wires 520 may be formed by operations similar to those for forming the seed layers 150 on the substrate 10 and forming the wires 510 on the seed layers 150. In some arrangements, the electronic module 20 includes a redistribution layer (RDL) 200, a plurality of solders 250, electronic components 260 and 260A, an encapsulant 270, an underfill 280, a stiffener ring 290, and an adhesive layer 290A.

Figure 4G:
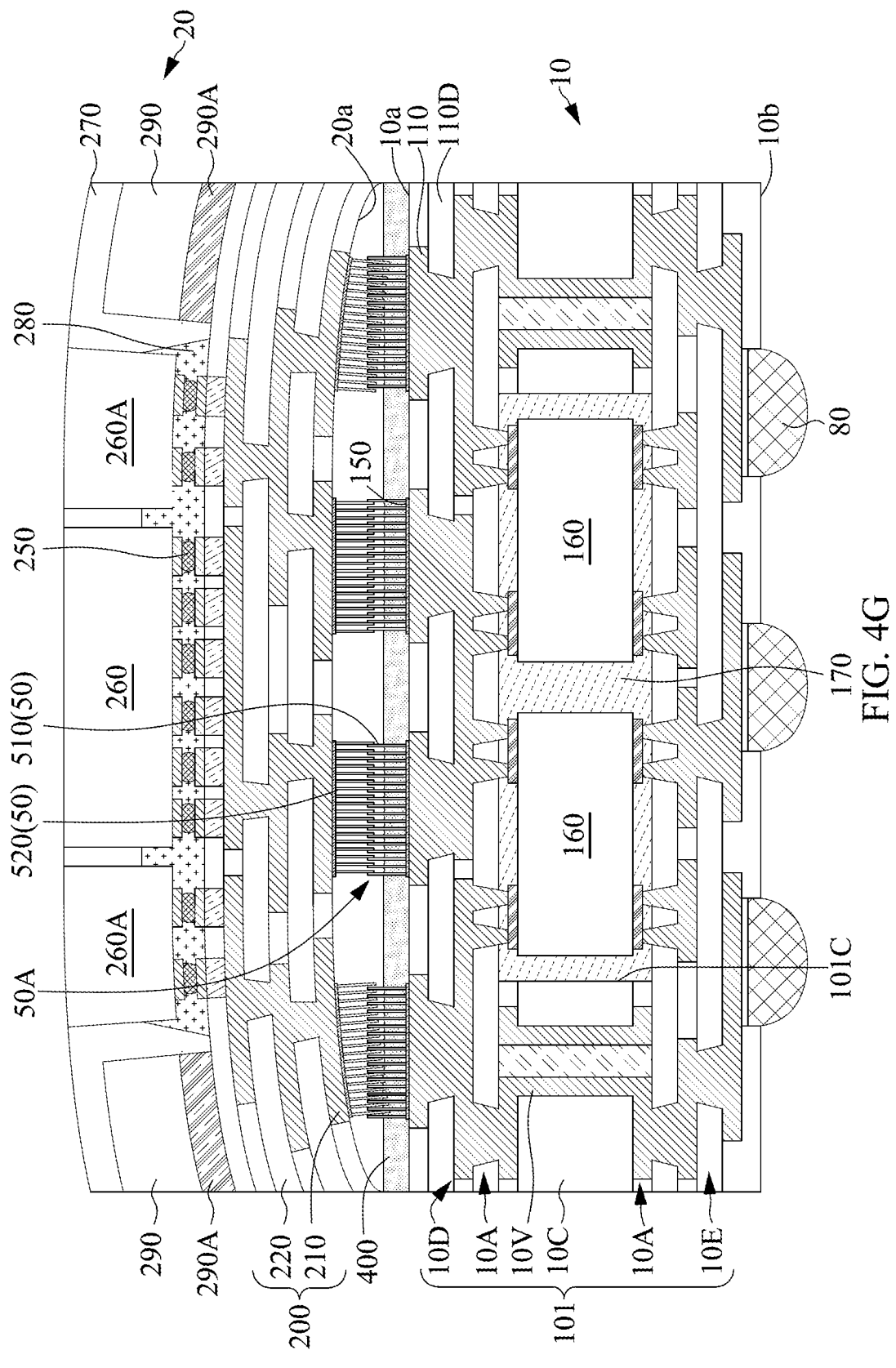

Referring to FIG. 4G, a bonding operation may be performed on the electronic module 20 and the substrate 10. In some arrangements, the electronic module 20 may be connected or bonded to the substrate 10 through the wires 510 and 520 and the filling material 400. In some arrangements, a bonding apparatus 800 (e.g., a bond head) may be used to push the electronic module 20 toward the substrate 10 to guide the wires 520 to contact the wires 510. In some arrangements, a pressure may be applied to the electronic module 20 to press the wires 520 against the wires 510. In the initial stage of the bonding operation, the wires 520 start to contact the wires 510, as shown in FIG. 4G. As the electronic module 20 keeps approaching the substrate 10, the wires 520 may start to tangle with the wires 510 so as to connect the wires 510 and 520. As the bonding apparatus 800 keeps applying pressure to the electronic module 20, the warpage of the bent structure of the electronic module 20 may start to reduce; that is, the electronic module 20 is less bent, thereby the warpage of the electronic module 20 is reduced after the electronic module 20 is bonded to the substrate 10 through the wires 510 and 520. In addition, with the wires 510 tangled with the wires 520, the relative position of the wires 510 to the wires 520 can be fixed, and a pulling strength in a vertical direction (i.e., in a direction from the substrate 10 toward the electronic module 20) can be provided, such that the electronic module 20 having a reduced warpage can be maintained by the pulling strength provided by the tangled wires 510 and 520.

In some arrangements, in the bonding operation, a heating operation may be performed to sinter the wires 510 and 520. In some arrangements, the heating operation may be performed to cure the filling material 400. In some arrangements, the heating operation may be performed under a temperature lower than a melting point of a soldering material. In some arrangements, the heating operation may be performed under a temperature lower than a temperature (e.g., about 260° C.) of a reflow operation for soldering materials. In some arrangements, the heating operation may be performed under a temperature equal to or lower than about 150° C. In some arrangements, the heating operation may be performed under a temperature equal to or lower than about 100° C. After the filling material 400 is cured to form an filling layer 40 (as shown in FIG. 4H), according to some arrangements of the present disclosure, the tangled wires 510 and 520 can be further protected by the filling layer 40, and thus the electronic module 20 having a reduced warpage can be better maintained by the pulling strength provided by the tangled wires 510 and 520.

Figure 4H:
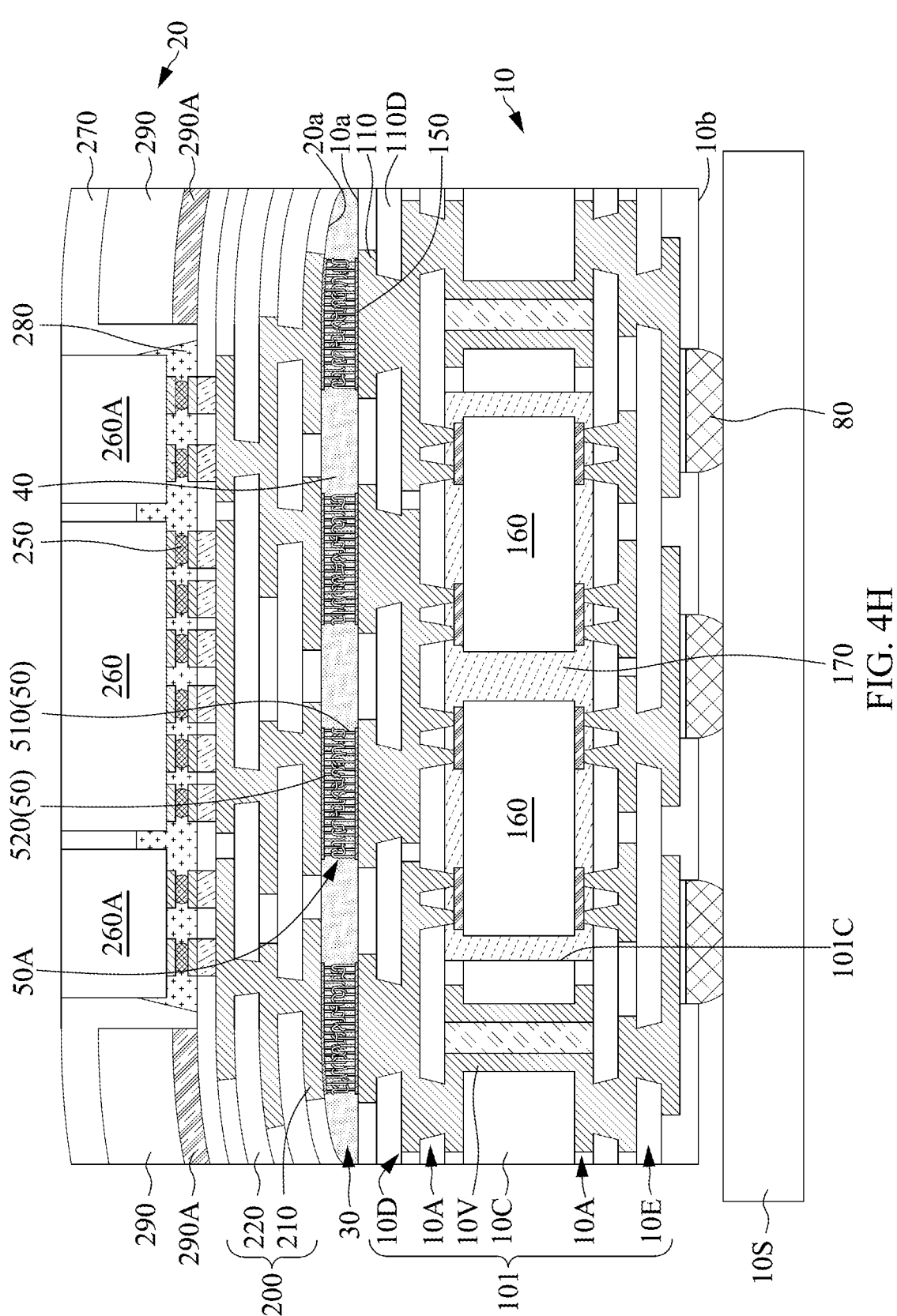

Referring to FIG. 4H, after the electronic module 20 is bonded to the substrate 10, the bonded structure may be disposed or electrically connected to a carrier 10S. In some arrangements, after the electronic module 20 is pressed or pushed by the bonding apparatus 800 to bond to the substrate 10, the original warpage of the bent structure of the electronic module 20 is reduced, as shown in FIGS. 4G-4H. As such, a package structure 1 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some arrangements, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific arrangements thereof, these descriptions and illustrations do not limit the present disclosure. It can be clearly understood by those skilled in the art that various changes may be made, and equivalent components may be substituted within the arrangements without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A package structure, comprising:
    a substrate;
    a redistribution layer (RDL) over the substrate; and
    a wire bundle structure between the RDL and the substrate, wherein the wire bundle structure comprises a first nanowire and a second nanowire extending from the substrate and a third nanowire extending from the RDL, wherein the third nanowire is tangled with the first nanowire and the second nanowire.

2. The package structure as claimed in claim 1, further comprising an insulative layer between the substrate and the RDL, and covering the first nanowire, the second nanowire, and the third nanowire.

3. The package structure as claimed in claim 2, wherein the third nanowire comprises a first portion contacting the insulative layer and a second portion free from contacting the insulative layer.

4. The package structure as claimed in claim 3, wherein the second portion of the third nanowire is proximal to the RDL and distal from the substrate.

5. The package structure as claimed in claim 1, wherein the substrate includes one or more electronic components embedded in the substrate, wherein the wire bundle structure comprises a tangled portion between and separated from the substrate and the RDL, the wire bundle structure further comprises a plurality of first wires extending from the substrate and a plurality of second wires extending from the RDL, and the tangled portion comprises a portion of the first wires and a portion of the second wires that contact each other.

6. A package structure, comprising:
    a substrate including a dielectric structure and a conductive structure formed in the dielectric structure;
    an electronic module over the substrate;
    a filling layer between the electronic module and the substrate; and
    a wire bundle structure in the filling layer, wherein the wire bundle structure comprises a tangled portion at least partially within an opening of the dielectric structure of the substrate.

7. The package structure as claimed in claim 6, wherein the wire bundle structure comprises a plurality of wires, the wires have a first end portion that is spaced apart from the filling layer, wherein the first end portion includes an oxidized end portion.

8. The package structure as claimed in claim 6, wherein a portion of an upper surface of the filling layer is spaced apart from the electronic module by a gap.

9. The package structure as claimed in claim 8, wherein the upper surface of the filling layer comprises a curved surface recessed toward the substrate, wherein the filling layer includes an underfill.

10. The package structure as claimed in claim 6, wherein the wire bundle structure comprises wires having curved portions.

11. The package structure as claimed in claim 6, wherein the wire bundle structure comprises a plurality of first nanowires extending from the substrate and a plurality of second nanowires extending from the electronic module, and the second nanowires are shorter than the first nanowires.

12. The package structure as claimed in claim 1, wherein the wire bundle structure (30) is configured to provide a vertical electrical connection between the RDL (20) and the substrate (10), wherein the RDL includes a dielectric structure and a plurality of conductive pads formed in the dielectric structure.

13. The package structure as claimed in claim 6, wherein the wire bundle structure is interlocked with the filling layer and configured to confine the filling layer within a coverage of the electronic module.

14. A package structure, comprising:

a semiconductor substrate;

a wiring structure over the semiconductor substrate, the wiring structure including a dielectric structure and a conductive structure formed in the dielectric structure; and a wire bundle structure between the wiring structure and the semiconductor substrate, wherein the wire bundle structure comprises a first nanowire bundle extending from the semiconductor substrate and a second nanowire bundle in contact with and extending from a lower surface of the wiring structure, wherein the first nanowire bundle contacts the second nanowire bundle.

15. The package structure as claimed in claim 14, wherein the semiconductor substrate comprises a first pad, the wiring structure comprises a second pad, the first nanowire bundle is formed on the first pad, and the second nanowire bundle is formed on the second pad, wherein the first nanowire bundle comprises a plurality of first wires extending from the first pad of the semiconductor substrate, and the second nanowire bundle comprises a plurality of second wires extending from the second pad of the wiring structure.

16. The package structure as claimed in claim 15, wherein the semiconductor substrate comprises a dielectric layer having an opening that exposes the first pad, and the wire bundle structure comprises a tangled portion at least partially within the opening, wherein a wire of the plurality of first wires extends into the dielectric layer.

17. The package structure as claimed in claim 15, further comprising a first seed layer on the first pad, wherein the plurality of first wires of the first nanowire bundle are formed on the first seed layer.

18. The package structure as claimed in claim 17, wherein the first seed layer includes Ti or Cu.

19. The package structure as claimed in claim 14, wherein the first nanowire bundle contacts the second nanowire bundle to form a first tangled portion and a second tangled portion spaced apart from the first tangled portion, a thickness of the first tangled portion is less than a thickness of the second tangled portion, and the second tangled portion is closer to an edge of the wiring structure than the first tangled portion is.

20. The package structure as claimed in claim 14, wherein the first nanowire bundle contacts the second nanowire bundle to form a tangled portion, and a thickness of the tangled portion increases toward an edge of the wiring structure.

* * * * *